(12) United States Patent
Lee

(10) Patent No.: US 6,545,925 B2
(45) Date of Patent: Apr. 8, 2003

(54) SEMICONDUCTOR DEVICE WITH SELF REFRESH TEST MODE

(75) Inventor: Terry R. Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/062,756

(22) Filed: Jan. 30, 2002

(65) Prior Publication Data

US 2002/0105843 A1 Aug. 8, 2002

Related U.S. Application Data

(63) Continuation of application No. 08/705,149, filed on Aug. 29, 1996, now Pat. No. 6,392,948.

(51) Int. Cl.$^7$ .................................................. G11C 7/00
(52) U.S. Cl. ...................................... 365/222; 365/201
(58) Field of Search ................................ 365/222, 201, 365/193

(56) References Cited

U.S. PATENT DOCUMENTS

| | | | |
|---|---|---|---|
| 4,317,169 A | 2/1982 | Panepinto, Jr. et al. |
| 4,453,237 A | 6/1984 | Reese et al. |
| 4,547,867 A | 10/1985 | Reese et al. |
| 4,672,583 A | 6/1987 | Nakaizumi |
| 5,270,982 A | 12/1993 | Watanabe |
| 5,295,109 A | 3/1994 | Nawaki |
| 5,299,168 A | 3/1994 | Kang |
| 5,299,969 A | 4/1994 | Zaruba |
| 5,299,970 A | 4/1994 | Fontaine |
| 5,349,562 A | 9/1994 | Tanizaki |
| 5,386,385 A | 1/1995 | Stephens, Jr. |
| 5,418,754 A | 5/1995 | Sakakibara |
| 5,446,695 A | 8/1995 | Douse et al. |
| 5,450,364 A | 9/1995 | Stephens, Jr. et al. |
| 5,627,791 A | 5/1997 | Wright et al. |
| 5,636,173 A | 6/1997 | Schaefer |
| 5,644,544 A | 7/1997 | Mizukami |

*Primary Examiner*—Richard Elms
*Assistant Examiner*—Jung H. Hur
(74) *Attorney, Agent, or Firm*—TraskBritt

(57) ABSTRACT

A semiconductor device (such as a DRAM) includes a memory array that has dynamic memory cells. In a self refresh test mode, a self refresh test mode controller monitors and/or controls various blocks and internal signals in the semiconductor device. The self refresh test mode controller may communicate with a remote testing device through various conductors including one or more DQ lines and/or one or more address lines. The self refresh test mode controller provides at least one or more of the following four functions: (1) the ability to control internal signals while in self refresh test mode; (2) the ability to monitor internal signals while in self refresh test mode; (3) the ability to put in a programmable delay, change the delay or change internal timing while in self refresh test mode (add delay or make delay programmable, adjustable); (4) the ability to have the device do a device read in a self refresh test mode (the DQ pins may be used to read particular data on the row, while the column addressees frozen). As examples, the following signals may be analyzed and acted upon by the self refresh test mode controller, or transmitted through the self refresh test mode controller to a remote testing device: (1) internal RAS signals; (2) bits from refresh counter; (3) RAS chain; and (4) equilibrate signals. As examples, the following are signals that may be received or produced by the self refresh test mode controller, and then analyzed and acted upon or transmitted through the self refresh test mode controller to one or more of the various blocks of the semiconductor device; (1) a signal overriding internal RAS signals generated by self refresh circuitry (including initiating a row change or the rate at which row change occurs); (2) a signal that causes control of incrementing a refresh counter; (3) signals that alter internal time or programmable delay elements.

39 Claims, 5 Drawing Sheets

SEMICONDUCTOR DEVICE WITH SELF REFRESH TEST MODE

CROSS-REFERENCE TO RELATED APPLICATION

This application is a continuation of application Ser. No. 08/705,149, filed Aug. 29, 1996, now U.S. Pat. No. 6,392,948 B1, issued May 21, 2002.

BACKGROUND OF THE INVENTION

Field of the Invention: The invention relates to a semiconductor device having dynamic memory, such as a DRAM device. More particularly, the invention relates to such a semiconductor device that includes a self refresh test mode in which self refresh is monitored and/or modified by an external testing device. The invention also includes a method for constructing such a semiconductor device.

State of the Art: DRAMS (dynamic random access memory) include numerous cells in which data are stored. Such cells may include capacitive elements to which a charge is applied to signify a high or low voltage. However, because of leakage, the voltage of the charge decreases over time, making the contents of the cells unreliable. Refresh involves reading a datum from a cell before the datum becomes corrupted and rewriting the datum into the cell. The read and rewriting process may be essentially simultaneous.

There are various types of DRAM devices and various types of refresh. DRAMs are often referred to as either "standard refresh" or "extended refresh." Whether a DRAM is a standard refresh or an extended refresh device may be determined by dividing the specified refresh time by the number of cycles. Table 1 lists some of the standard DRAMs that have been marketed by Micron Technology, Inc., assignee to the present invention, and their refresh specifications:

| DRAM | REFRESH TIME | NO. OF CYCLES | REFRESH RATE |
|---|---|---|---|
| 4 Meg × 1 | 16 ms | 1,024 | 15.6 μs |
| 256K × 16 | 8 ms | 512 | 15.6 μs |
| 256K × 16 (L version) | 64 ms | 512 | 125 μs |
| 4 Meg × 4 (2K) | 32 ms | 2,048 | 15.6 μs |
| 4 Meg × 4 (4K) | 64 ms | 4,096 | 15.6 μs |

DRAMs having refresh rates of 15.6 μs are standard refresh devices, while DRAMs having refresh rates of substantially greater than 15.6 μs/row are extended refresh devices.

Two basic means of performing refresh are distributed and burst refresh. Distributing the refresh cycles so that they are evenly spaced is known as distributed refresh. When not being refreshed, the DRAM may be read from or written to. In distributed refresh, the DRAM controller is set up to perform a refresh cycle, for example, every 15.6 μs. Usually, this means the controller allows the current cycle to be completed, and then holds off all instructions while a refresh is performed on the DRAM. The requested cycle is then allowed to resume. Refresh may be achieved in a burst method by performing a series of refresh cycles, one right after the other until all rows have been accessed. During refresh, other commands are not allowed.

Different cycles may be used to refresh DRAMs, all of which may be used in a distributed or burst method. Standard refresh types include (1) $\overline{RAS}$-ONLY refresh, (2) $\overline{CAS}$-BEFORE-$\overline{RAS}$ (CBR) refresh, and (3) Hidden refresh. To perform a $\overline{RAS}$-ONLY refresh, a row address is put on the address lines and then $\overline{RAS}$ is dropped. When $\overline{RAS}$ falls, that row will be refreshed and, as long as $\overline{CAS}$ is held high, the Dqs will remain open.

The DRAM controller provides addresses of cells to be refreshed. The row order of refreshing does not matter as long as each row is refreshed in the specified amount of time.

A CBR refresh cycle is performed by dropping $\overline{CAS}$ and then dropping $\overline{RAS}$. One refresh cycle will be performed each time $\overline{RAS}$ falls. $\overline{WE}$ (write enable) is held high while $\overline{RAS}$ falls. The Dqs will remain open during the cycle. In the case of CBR refresh, an internal counter is initialized to a random count when the DRAM device is powered up. Each time a CBR refresh is performed, the device refreshes a row based on the counter, and then the counter is incremented. When CBR refresh is performed again, the next row is refreshed and the counter is incremented. The counter will automatically wrap and continue when it reaches the end of its count. There is no way to reset the counter. Row addresses are not externally supplied or monitored. $\overline{CAS}$ is held low before and after $\overline{RAS}$ falls to meet 'CSR and 'CHR. $\overline{CAS}$ may stay low and only $\overline{RAS}$ toggles. Every time $\overline{RAS}$ falls, a refresh cycle is performed. $\overline{CAS}$ may be toggled each time, but it is not necessary. The address buffers are powered-down because CBR refresh uses the internal counter and not an external address. For power sensitive applications, this may be a benefit, because there is no additional current used in switching address lines on a bus, nor will the DRAMs pull extra power if the address voltage is at an intermediate state. Because CBR refresh uses its own internal counter, there is not a concern about the controller having to supply the refresh addresses.

In Hidden refresh, the user does a READ or WRITE cycle and then, leaving $\overline{CAS}$ low, brings $\overline{RAS}$ high (for minimum of 'RP) and then low. Since $\overline{CAS}$ was low before $\overline{RAS}$ went low, the part will execute a CBR refresh. In a READ cycle, the output data will remain valid during the CBR refresh. The refresh is "hidden" in the sense that data-out will stay on the lines while performing the function. READ and Hidden refresh cycles will take the same amount of time: 'RC. The two cycles together take 2×'RC. A READ followed with a standard CBR refresh (instead of a Hidden refresh) would take the same amount of time: 2×'RC.

A self refresh mode helps maximize power savings in DRAMS and provide a very low-current data-retention mode. Low-power, extended-refresh DRAMs (LPDRAMs) have the same functionality as a standard DRAM, except they have been tested to meet the lower CMOS standby current and the extended refresh specifications. Self refresh DRAMs, on the other hand, require additional circuitry to be added to the standard DRAM to perform the self refresh function.

Self refresh mode provides the DRAM with the ability to refresh itself while in an extended standby mode (sleep or suspend). It is similar to the extended refresh mode of an LPDRAM except the self refresh DRAM utilizes an internally generated refresh clock while in the self refresh mode. During a system's suspend mode, the internally generated refresh clock on the DRAM replaces the DRAM controller refresh signals. Therefore, it is no longer necessary to power-up the DRAM controller while the system is in the suspend mode. Consulting the devices' data sheets will determine the power savings achieved.

Self refresh may employ parameters 'RASS, 'CHD and 'RPS. The DRAM's self refresh mode is initiated by executing a $\overline{CAS}$-BEFORE-$\overline{RAS}$ (CBR) refresh cycle and holding both $\overline{RAS}$ and $\overline{CAS}$ LOW for a specified period. The industry standard for this value is 100 μs minimum ($^t$RASS). The DRAM will remain in the self refresh mode while $\overline{RAS}$ is LOW. Once $\overline{CAS}$ has been held LOW for $^t$CHD, $\overline{CAS}$ is no longer required to remain LOW and becomes a "don't care."

The self refresh mode is terminated by taking $\overline{RAS}$ HIGH for $^t$RPS (the minimum time of an operation cycle). Once the self refresh mode has been terminated, the DRAM may be accessed normally.

Self refresh may be implemented in both a distributed method and a wait and burst method. In a system that utilizes distributed CBR refresh as the standard refresh, accesses to the DRAM may begin as soon as self refresh is exited. The first CBR pulse should occur immediately prior to active use of the DRAM to ensure data integrity. Since CBR refresh is commonly implemented as the standard refresh, this ability to access the DRAM immediately after existing self refresh is a big benefit over the burst scheme described later. If anything other than CBR refresh is used as the standard refresh, a burst of all rows should be executed when exiting self refresh. This is because the CBR counter and the DRAM controller counter will not likely be at the same count. If the CBR counter and the DRAM controller counter are not at the same count and both are being used in the distributed method, then refresh will be violated and data will eventually be lost.

Self refresh may be implemented with an internal burst refresh scheme. Instead of turning on a row at regular intervals, a circuit would sense when the array needs to be refreshed and then sequence through the rows until all had been refreshed. When exiting a burst type self refresh, the entire array must be refreshed before any accesses are allowed, regardless of the type of refresh used. This full burst is necessary because self refresh may have been exited just before the entire array was going to be refreshed. If the burst is not performed when exiting this type of self refresh, the refresh requirements may be violated, leading to lost data.

Some DRAMs allow access to the DRAM as soon as self refresh is exited, while other DRAMs may require a full burst when exiting, regardless of the refresh used. To prevent possible compatibility problems, the controllers are designed to perform the burst when existing self refresh.

FIG. 1. shows a functional block diagram for an exemplary prior art DRAM 10. It will be apparent to those skilled in the art that there are different types of DRAMs and that there is some flexibility in the choice of block diagrams to characterize the DRAM. It will also be apparent that for clarity and simplicity various components and conductors are not shown, but that an understanding of such components and conductors are within the knowledge of those skilled in the art. Accordingly, FIG. 1 is only exemplary. Referring to FIG. 1, data is written to or read from memory locations (or cells) of a memory array 14 through sense amplifier and input/output gating 18, data-in buffer 22 and data-out buffer 24. In ordinary operation, the address of a particular cell to be written to or read from is selected by a row decoder 28 and a column decoder 34 under the direction of addresses A0–A9, which are processed by row address buffers 38 and column address buffers 40. DRAM 10 may include a complement select and row select circuit between row decoder 28 and array 14.

A $\overline{RAS}$ signal is received by a clock generator 44 which in response thereto supplies the $\overline{RAS}$ signal to a refresh controller and self refresh oscillator and timer 64. Clock generator 44 also supplies clock signals to sense amp and input/output gating 18, row decoder 28, a clock generator 48. A $\overline{CAS}$ signal is supplied to control logic 56, a clock generator 48, column address buffers 40, and refresh controller and self refresh oscillator and timer 64. A write enable $\overline{WE}$ signal and an output enable $\overline{OE}$ signal are also received by control logic 56. Control logic 56 controls data-in buffer 22 and data-out buffer 24 based on the state of $\overline{CAS}$, $\overline{WE}$, and $\overline{OE}$, and a clock signal from clock generator 48, according to well known protocols.

In self refresh mode, refresh controller and self refresh oscillator and timer 64 and a refresh counter 66 control the row address of the cell to be refreshed, while the column cells are refreshed simultaneously.

There may be difficulties in testing DRAM devices that incorporate self refresh mode if the failures are present during self refresh operation. This complication may result because the external testing device no longer has control of internal DRAM clock signals such as $\overline{RAS}$ and $\overline{CAS}$. Once the self refresh mode is entered, the DRAM internally times the necessary clock signals, and the external signals are ignored, except for external $\overline{RAS}$ which is used to terminate self refresh. A difficult test problem is encountered when a device failure occurs related to self refresh. In other failure modes, it is possible to vary timing to determine sensitivities of the failure to aid in troubleshooting the problem. In some cases, the failure is related to the period of the cycle the DRAM is in when self refresh is exited.

Prior systems have been proposed to provide signals indicative of the operations of a DRAM during self refresh. For example, U.S. Pat. No. 5,450,364 to Stephens, Jr. et al. describes a system the purpose of which is to create significant time savings in testing self refresh operation. The system is purported to generate a signal upon completion of the self refresh cycle, thus allowing a fast determination of whether the self refresh cycle has been completed within the pause time of the memory part. U.S. Pat. No. 5,418,754 to Sakakibara describes a system in which a self refresh cycle time is purported to be directly measured at a data output pin. U.S. Pat. No. 5,299,168 to Kang proposes a semiconductor memory circuit having a refresh address test circuit for detecting whether all of the refresh addresses have been generated.

However, these prior systems do not allow an external testing device to have general access to internal signals such as $\overline{RAS}$, $\overline{CAS}$, or other timing signals during self refresh.

Accordingly, there remains a need for a memory device such as a DRAM that contains circuitry that allows an external testing device to have general access to internal signals of the memory device, as well as provide external control or modification of the self refresh cycle while in a test mode.

SUMMARY OF THE INVENTION

The present invention relates to a semiconductor device having dynamic memory, and a system and method for testing self refresh functions of the semiconductor device. The semiconductor device may include an interface for connection with an external device such as a testing device that may supervise the testing of the self refresh functions and analyze information transmitted from the semiconductor device regarding the refresh. Information regarding the testing may be transmitted to the external testing device in real time or after the conclusion of the testing. Alternatively, the testing may be done internally without the aid of the external tester. However, information regarding the testing would be transmitted to an external device, in real time or otherwise.

The semiconductor device may include self refresh circuitry, selection circuitry, and a self refresh test mode controller.

The self refresh circuitry may produce refresh signals including preliminary refresh signals and location refresh signals. At least some of the preliminary signals are used in producing the location refresh signals. Still other refresh signals may control various aspects of self refresh, such as communicating with the circuits in the semiconductor device or with the external device. The self refresh circuitry may include a refresh controller and a refresh counter.

The selection circuitry may receive the location refresh signals and select memory locations within the memory array to be refreshed according to the values of the location refresh signals. The memory of the semiconductor device may be a memory array having rows and columns. The memory locations selected by the selection circuitry may be rows. The memory location selecting circuitry may be directly or indirectly responsive to the location refresh signals.

The self refresh test mode controller may interact with the self refresh circuitry and transmits indicating signals to the interface that are indicative of at least one of the refresh signals. The indicating signals may be indicative of some or all of the preliminary refresh signals, some or all of the location refresh signals, or other refresh signals. The preliminary refresh signals may include row address strobe signals and/or column address strobe signals. The external testing device may analyze the indicating signals to evaluate the refreshing of the memory array, including a failure in refreshing.

The self refresh test mode controller provides at least one or more of the following four functions: the ability to control internal signals while in self-refresh mode; the ability to monitor internal signals while in self-refresh mode; the ability to add a programmable delay, change the delay, or change internal timing while in self-refresh mode; and the ability to have the device do a device read in a self refresh test mode.

The external control of self refresh would generally only be allowed when in a self refresh test mode, rather than in normal operation of self refresh.

A semiconductor device may include more than one memory array and more than one die.

The interface may include address lines, DQ lines, and/or other lines including those not ordinarily activated.

The interaction between the self refresh test mode controller and the self refresh circuitry may include merely monitoring at least some of the refresh signals, or in addition include controlling some aspect of the self refresh circuitry, such as controlling the production of some or all refresh signals.

A sense amplifier and input/output gating and a self refresh oscillator and timer may assist in the performance of the self refresh.

The self refresh circuitry and the self refresh test mode controller each may be dedicated hardware, or may be included within a microprocessor.

The invention includes a method for making and operating such a semiconductor device and a system including an external testing device connectable to the semiconductor device. The external testing device may test more than one semiconductor device according to the invention (which may but do not have to be identical) simultaneously or essentially simultaneously.

A semiconductor device according to the present invention may be a DRAM, or a variety of other devices having dynamic memory, including a microprocessor and an ASIC (application specific integrated circuit).

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PREFERRED EMBODIMENTS

Figure 2:
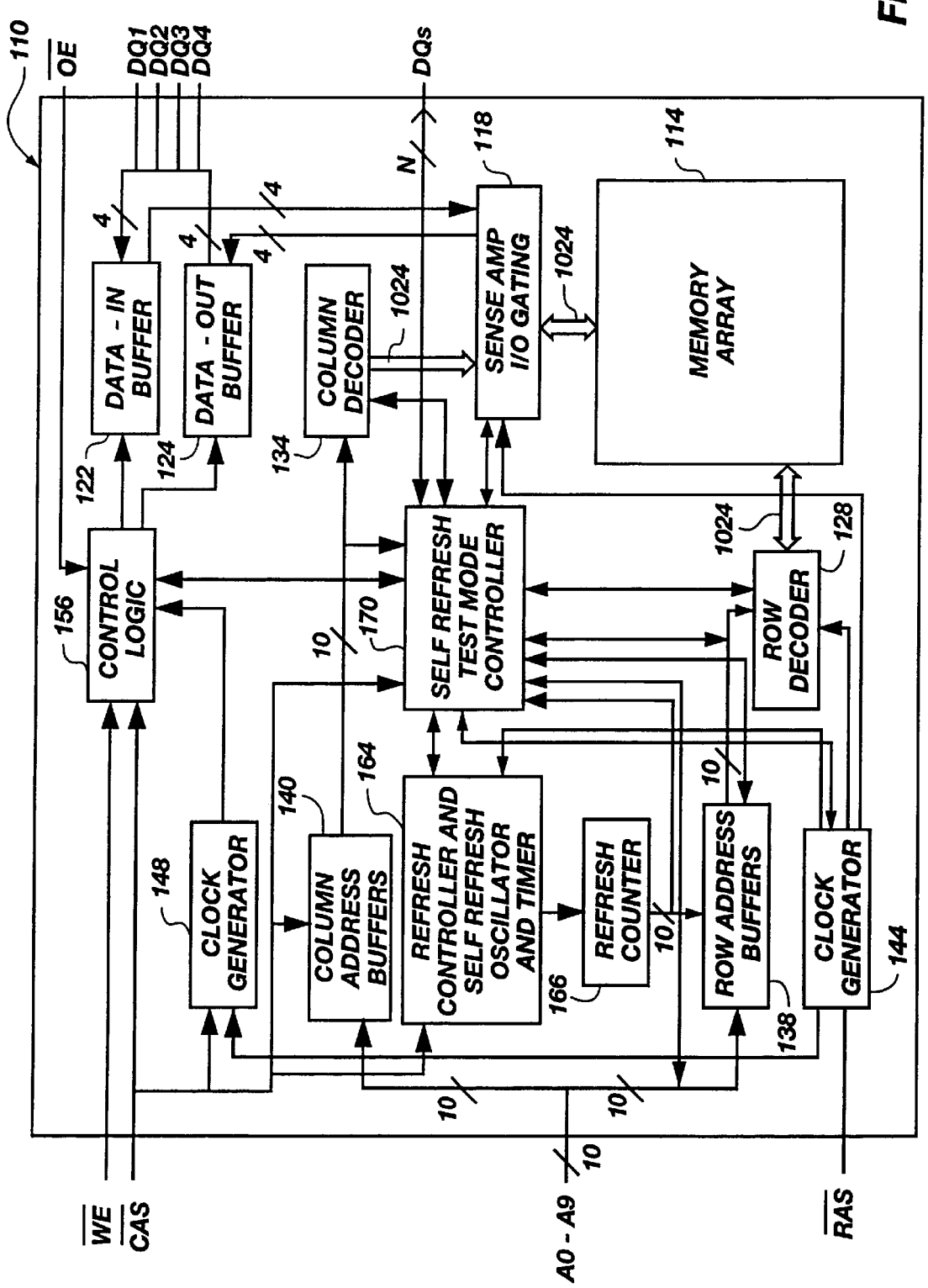
FIG. 2 shows a functional block diagram of a semiconductor device according to the present invention.

Referring to FIG. 2, a semiconductor device 110 (such as a DRAM) includes a memory array 114 that has dynamic memory cells. Data is written to or read from memory locations or cells of memory array 114 through sense amplifier and input/output gating 118 and data-in buffer 122 and data-out buffer 124. Although only four DQ lines are illustrated in connection with data-in buffer 122 and data-out buffer 124, there could be a greater or lesser number of DQ lines. Further, although it is not ordinarily preferred, separate input and output lines could be used rather than DQ lines.

In ordinary operation, the address of a particular memory location or cell to be written to or read from is selected by a row decoder 128 and a column decoder 134 under the direction of addresses A0–A9, which are processed by row address buffers 138 and column address buffers 140. Semiconductor device 110 may include a complement select and row select between row decoder 128 and array 114. There may be more or less than ten address lines.

A $\overline{RAS}$ signal is received by a clock generator 144 which in response thereto supplies the $\overline{RAS}$ signal to a refresh controller and self refresh oscillator and timer 164. Clock generator 144 also supplies clock signals to sense amp and input/output gating 118, row decoder 128, and clock generator 148. A $\overline{CAS}$ signal is supplied to control logic 156, a clock generator 148, column address buffers 140, and refresh controller and self refresh oscillator and timer 164. A write enable $\overline{WE}$ signal and an output enable $\overline{OE}$ signal are also received by control logic 156. Control logic 156 controls data-in buffer 122 and data-out buffer 124 based on the state of $\overline{CAS}$, $\overline{WE}$, and $\overline{OE}$, and a clock signal from clock generator 148, under well known operations.

In self refresh test mode, the refresh controller and self refresh oscillator and timer 164, and a refresh counter 166 control the row address of the memory locations to be refreshed, while the column cells may be refreshed simultaneously.

Figure 1:
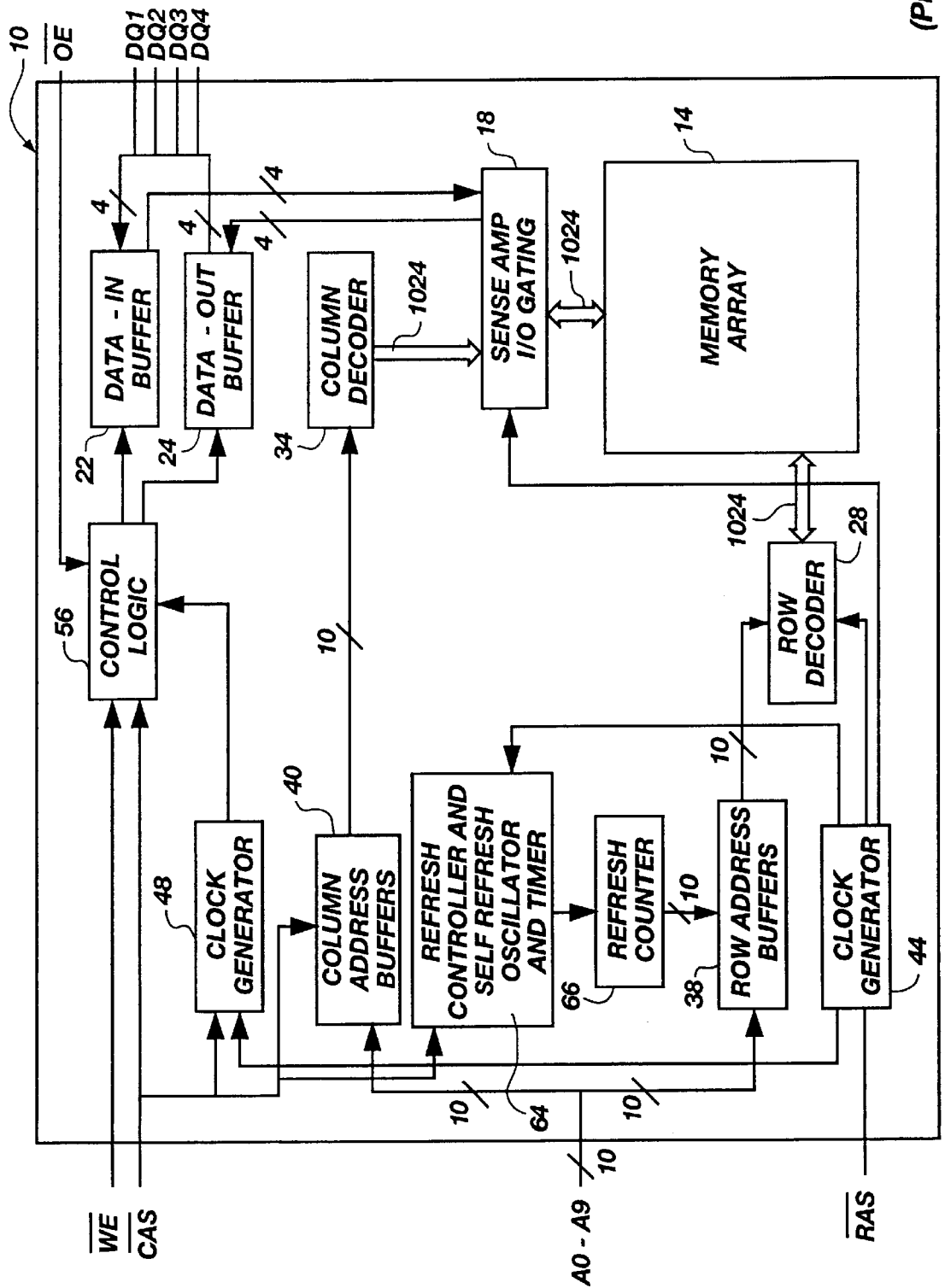
FIG. 1 shows a functional block diagram of an exemplary prior art DRAM.

Except as described below, the blocks of FIG. 2 described heretofore may be identical to or differ somewhat from the blocks of FIG. 1.

In a self refresh test mode, a self refresh test mode controller 170 monitors and/or controls various blocks and internal signals on conductors between blocks in semiconductor device 110. The self refresh test mode may be entered or initiated by a particular sequence of inputs such as, for example, WCBR ($\overline{W}\,\overline{E}$ and $\overline{C}\,\overline{A}\,\overline{S}$ before $\overline{R}\,\overline{A}\,\overline{S}$) operations. Alternatively, the self refresh test mode may be initiated by activation of a single line or more than one line.

The external control of self refresh would generally only be allowed when in a self refresh test mode, rather than in normal operation of self refresh. However, monitoring and control of self refresh signals and self refresh could occur during ordinary operation of the semiconductor device.

Self refresh test mode controller 170 may communicate with a testing device (shown in FIG. 4) through various conductors including one or more DQ lines and/or one or more address lines. In FIG. 2, N conductors are shown as being connected to DQ lines, where N is equal to or greater than one. In some cases, output buffers will need to be added to address pins.

In FIG. 2, conductors are shown between self refresh test mode controller 170 and a wide variety of blocks and conductors. In practice, it is expected that self refresh test mode controller 170 would not be connected to so many blocks and conductors. However, FIG. 2 illustrates a variety of possibilities. Different embodiments of the invention may include different combinations of these conductors. Some embodiments may include only one of the conductors. Further, self refresh test mode controller 170 may be connected to and monitor and/or control additional blocks and conductors for which FIG. 2 does not show a connection.

Figure 3:
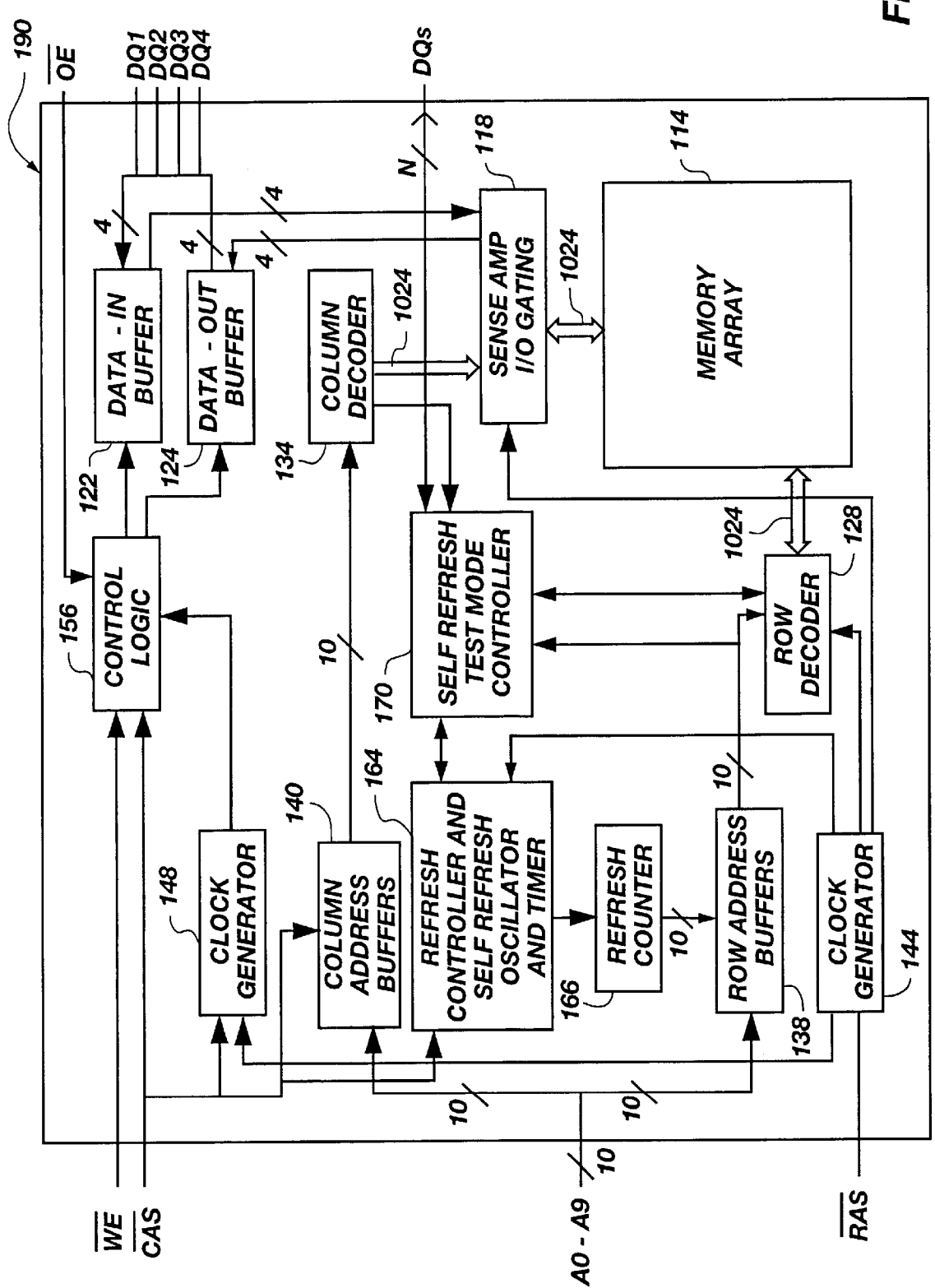
FIG. 3 shows a functional block diagram of a more specific embodiment of a semiconductor device according to the present invention.

As a more specific example, in FIG. 3 a semiconductor device 190 is identical to semiconductor device 110 in FIG. 2 except that a self refresh test mode controller 170 is connected to fewer blocks and conductors between blocks.

Refresh controller and self refresh oscillator and timer 164 and refresh counter 166 are examples of self refresh circuitry. However, self refresh circuitry may be implemented through a variety of means. In this respect, refresh controller and self refresh oscillator and timer 164 and refresh counter 166 may be implemented in dedicated hardware or through a microprocessor. Refresh controller and self refresh oscillator and timer 164 and refresh counter 166 produce a variety of signals which may be considered self refresh signals in that they are directly or indirectly involved with the self refresh process. There are a variety of self refresh signals. The signals from row decoder 128 may be considered location refresh signals because they control the memory location in memory array 114 that is refreshed.

Other signals produced by refresh controller and self refresh oscillator and timer 164, refresh counter 166, and other components are considered to be preliminary refresh signals in that they are preliminary to some other functions. For example, the signals passing between refresh counter 166 and row address buffers 138 are preliminary to the location refresh signals and are considered to be preliminary refresh signals. Depending on how it is viewed, the signals at the outputs of row address buffers 138 and row decoder 128 may be considered to be preliminary refresh signals or location refresh signals.

Self refresh test mode controller 170 provides at least one or more of the following four functions:

(1) the ability to control internal signals while in self-refresh mode;

(2) the ability to monitor internal signals while in self-refresh mode;

(3) the ability to add a programmable delay, change the delay, or change internal timing while in self-refresh mode; and (4) the ability to have the device do a device read in a self refresh test mode (the DQ pins may be used to read particular data on the row, while the column address is frozen).

Merely as examples, the following signals may be analyzed and acted upon by self refresh test mode controller 170, or transmitted through self refresh test mode controller 170 to conductors connected to a remote testing device.

(1) internal $\overline{R}\,\overline{A}\,\overline{S}$ signals;

(2) bits from refresh counter 166 (note that self refresh test mode controller 170 may initiate a row change or the rate at which row changes occur);

(3) $\overline{R}\,\overline{A}\,\overline{S}$ chain; and (4) equilibrate signals.

Merely as examples, the following are signals that may be received or produced by self refresh test mode controller 170, and then analyzed and acted upon or transmitted through self refresh test mode controller 170 to one or more of the various blocks of semiconductor device 110:

(1) a signal overriding internal $\overline{R}\,\overline{A}\,\overline{S}$ signals generated by self refresh circuitry (including initiating a row change or the rate at which row change occurs);

(2) a signal that controls incrementing of refresh counter 166 (which may be useful in, for example, analyzing a failure that consistently occurs at same row); and (3) signals that alter an internal time or programmable delay element;

The structure of self refresh test mode controller 170 will depend on the particular functions it is to perform. Self refresh test mode controller 170 may be hardwired or programmable, allowing ease in determining which signals to observe in semiconductor device 110. Self refresh test mode controller 170 may be accessible to the various blocks and signals of semiconductor device 110 through one or more common buses. If the blocks are implemented in a microprocessor, the microprocessor may have access to essentially all aspects of all blocks.

Figure 4:
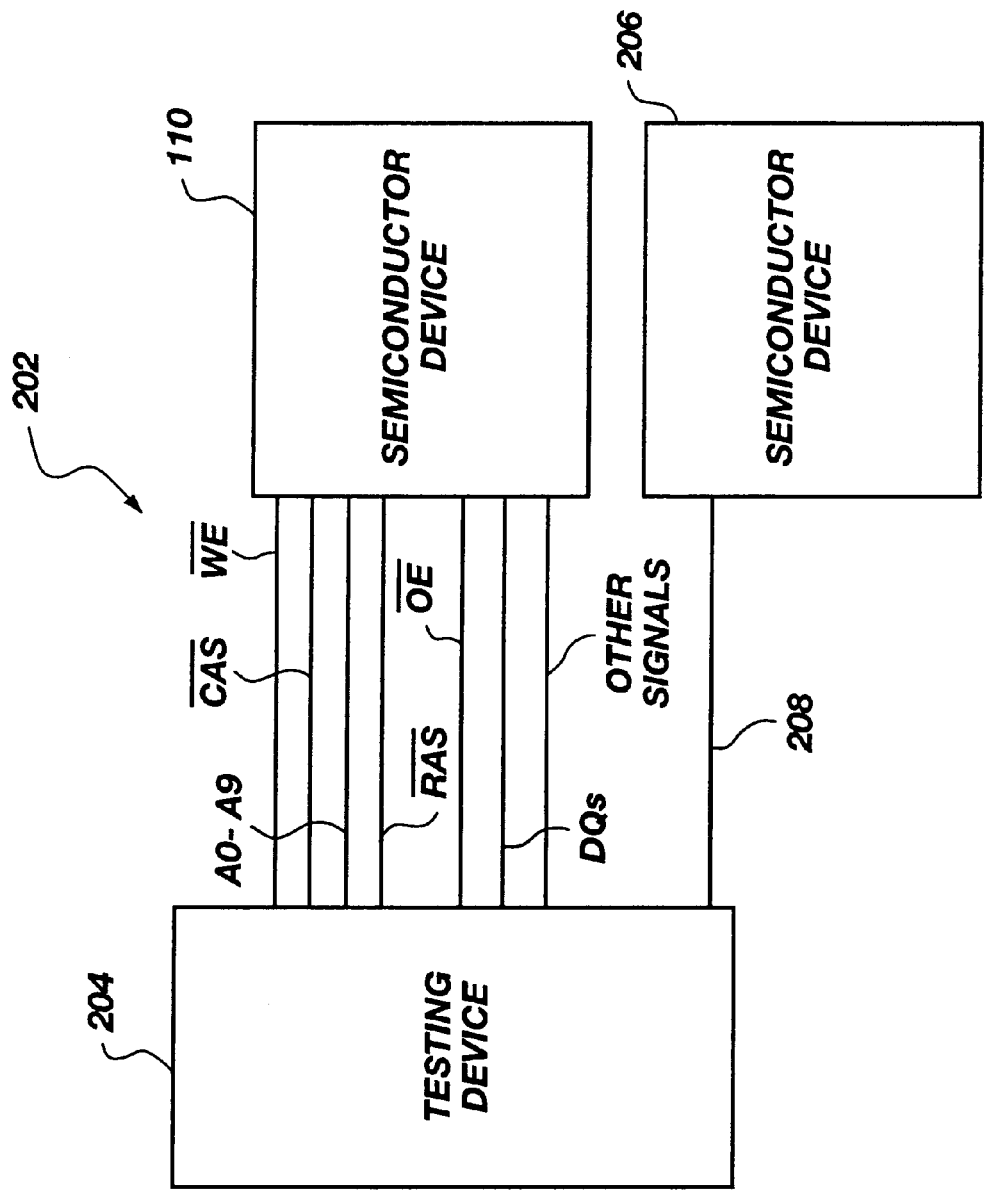
FIG. 4 shows a block diagram of a system including a testing device and semiconductor devices according to the present invention.

Referring to FIG. 4, a system 202 includes a testing device 204 that is external to semiconductor device 110 and that communicates with semiconductor device 110 through conductors that carry $\overline{W}\,\overline{E}$, $\overline{C}\,\overline{A}\,\overline{S}$, address (e.g. A0–A9), $\overline{R}\,\overline{A}\,\overline{S}$, $\overline{O}\,\overline{E}$, and input/output signals (eg. on DQ lines), and perhaps other signals. Depending on the implementation, not all of these signals are necessary. Further, some signals may originate from a source other than testing device 204. Testing device 204 and semiconductor device 110 may be configured so that testing device 204 may communicate with and program or otherwise control self refresh test mode controller 170. Testing device 204 may analyze and possibly repair semiconductor device 110 based on signals testing device 204 receives from semiconductor device 110 regarding self refresh operation. Testing device 204 preferably tests more than one semiconductor device simultaneously or essentially simultaneously. For example, a semiconductor device 206 according to the present invention (which may be, but is not required to be, identical to semiconductor device 110 or 190) is tested by testing device 204. A conductor 208 may, but is not required to, carry the same signals as are carried between testing device 204 and semiconductor device 10.

Figure 5:
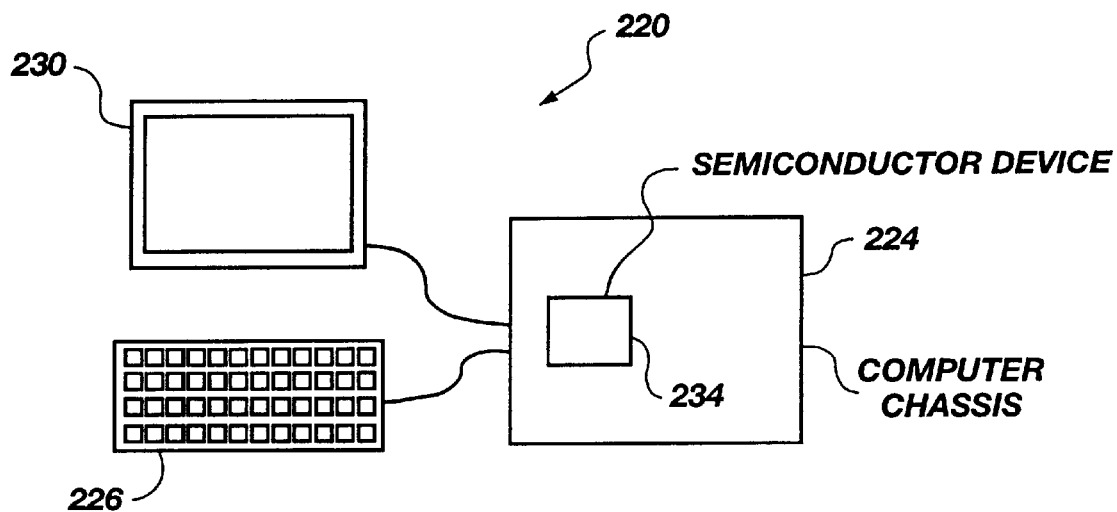
FIG. 5 shows a computer system in block diagram form that includes a semiconductor device according to the present invention.
Figure 6:
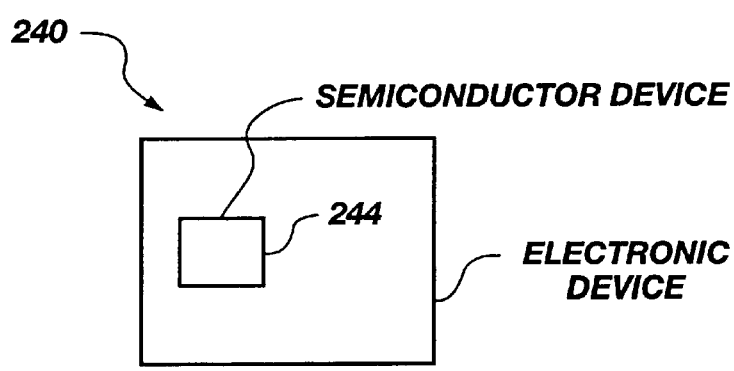
FIG. 6 shows an electronic device in block diagram form that includes a semiconductor device according to the present invention.

In a preferred embodiment, self refresh test mode controller 170 continues to be part of semiconductor device 110 (although preferably it is not operational) after testing of semiconductor 110 is completed and semiconductor device 110 is in ordinary operation. For example, FIG. 5 illustrates a computer system 220 that includes a computer chassis 224, a key board 226, and a display monitor 230. Computer chassis 224 includes various electronic components including semiconductor device 234, which is a semiconductor device according to the present invention, such as is illustrated in FIGS. 2 and 3. As another example, FIG. 6 illustrates an electronic device 240 that includes various electronic components including a semiconductor device 244 according to the present invention, such as is illustrated in FIGS. 2 and 3. Electronic device 240 could be, without limitation, memory devices, printers, displays, keyboards, computers (such as computer system 220), oscilloscopes, medical diagnostic equipment, and automobile control systems, to name only a few.

Semiconductor devices 110 and 190 may be a DRAM or essentially any other semiconductor device with dynamic memory, including microprocessors and ASICs. The DRAM may also be a synchronous DRAM. Semiconductor devices 110 and 190 may have more than one die. Each die may include one or more than one memory array. Further, at the time of any testing, semiconductor devices 110 and 190 may be a chip on a wafer, a bare chip off a wafer, a packaged chip including a package and leads. Semiconductor devices 110 and 190 (or other semiconductor devices within the invention) may be in a first-level package (e.g. DIP, SIP, ZIP, etc.) and in higher-level package assemblies (e.g., MCM's, including SIMM's and DIMM's, etc.). Semiconductor devices 110 and 190 (or other semiconductor devices within the invention) may be packetized protocol DRAMs in which at least two signals are supplied serially on a single conductor. Semiconductor devices 110 and 190 (or other semiconductor devices within the invention) may be multi-bank DRAMs (e.g. having 16 independent memory arrays).

A memory array does not have to store data in sequential rows or columns. Merely as an example, many semiconductor devices include redundant memory elements (such as a row) so that if a particular row is defective, it can be replaced by another row that is not defective.

Those skilled in the art appreciate that there are various structures for implementing dynamic memory. Accordingly, the invention is not limited to the particular examples in the FIGS.

As used in the claims, the terms "connect," "connectable," or "connected" are not necessarily limited to a direct connection. For example, there may be buffers or other components between two elements, making them indirectly connected. In this respect, the figures are only in block diagram form. Various well known components have been omitted from the disclosure because their description would tend to obscure the actual invention. Although certain conductors in FIG. 2 are shown as only a single line, semiconductor device 110 may be implemented with parallel conductors in place of a single conductor. Also, signals, such as the row and column address strobes, output enable, and write enable, may be active low or active high.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A semiconductor device comprising:
   an interface for receiving self refresh test control signals from an external device;
   a memory array;
   a self refresh test mode controller coupled to the interface for outputting internal test control signals in response to the self refresh test control signals during a self refresh test mode of the semiconductor device, the self refresh test mode controller including circuitry for outputting indicating signals;
   self refresh circuitry coupled to the self refresh test mode controller for producing refresh signals including preliminary refresh signals and location refresh signals in response to the internal test control signals during the self refresh test mode, with at least some of the preliminary refresh signals being used in producing the location refresh signals; and
   selection circuitry coupled to the self refresh circuitry and the memory array for selecting memory locations within the memory array to be refreshed in response to the location refresh signals.

2. The semiconductor device of claim 1, wherein the self refresh test mode controller includes circuitry for outputting indicating signals that are indicative of at least one of the refresh signals through the interface to the external device.

3. The semiconductor device of claim 2, wherein the indicating signals are indicative of the location refresh signals.

4. The semiconductor device of claim 2, wherein the indicating signals are indicative of at least some of the preliminary refresh signals.

5. The semiconductor device of claim 2, wherein the indicating signals are indicative of at least some of the preliminary refresh signals and of the location refresh signals.

6. The semiconductor device of claim 1, wherein the memory array includes rows and columns, and the memory locations selected by the selection circuitry are rows.

7. The semiconductor device of claim 1, wherein the refresh signals include row address strobe signals.

8. The semiconductor device of claim 1, wherein the refresh signals include column address strobe signals.

9. The semiconductor device of claim 1, wherein the memory array is a first memory array, and further comprising a second memory array that is refreshed in response to the self refresh circuitry, which refresh is monitored by the self refresh test mode controller.

10. The semiconductor device of claim 1, wherein the memory array is a first memory array, the self refresh circuitry is a first self refresh circuitry, and the self refresh test mode controller is a first self refresh test mode controller, and further comprising a second memory array, a second self refresh circuitry, and a second self refresh test mode controller, wherein the second memory array is refreshed in response to the second self refresh circuitry monitored by the second self refresh test mode controller.

11. The semiconductor device of claim 1, wherein the interface includes address lines.

12. The semiconductor device of claim 1, wherein the interface includes DQ lines.

13. The semiconductor device of claim 1, wherein the interface includes lines activated when the self refresh test mode controller is activated.

14. The semiconductor device of claim 1, wherein the selection circuitry is directly responsive to the location refresh signals.

15. The semiconductor device of claim 1, wherein the selection circuitry is indirectly responsive to the location refresh signals.

16. The semiconductor device of claim 1, further comprising a sense amplifier and input/output gating assisting in the performance of the self refresh test mode.

17. The semiconductor device of claim 1, wherein the self refresh circuitry includes a self refresh oscillator and timer.

18. The semiconductor device of claim 1, wherein the self refresh circuitry includes a refresh controller and a refresh counter.

19. The semiconductor device of claim 1, further including a column decoder.

20. The semiconductor device of claim 1, wherein the selection circuitry includes a column decoder.

21. The semiconductor device of claim 1, wherein the refresh signals include signals in addition to the preliminary refresh signals and the location refresh signals, the additional signals controlling various functions of self refresh.

22. The semiconductor device of claim 1, wherein the self refresh circuitry and the self refresh test mode controller are each dedicated hardware.

23. The semiconductor device of claim 1, wherein the self refresh circuitry and the self refresh test mode controller are each included in a microprocessor.

24. The semiconductor device of claim 1, wherein the semiconductor device is a synchronous DRAM.

25. The semiconductor device of claim 1, wherein the semiconductor device is a packetized protocol DRAM.

26. The semiconductor device of claim 1, wherein the semiconductor device is a multibank DRAM.

27. A semiconductor device comprising:
an interface allowing connection with an external device;
a memory array;
self refresh circuitry for producing refresh signals including preliminary refresh signals and for producing location refresh signals, at least some of the preliminary refresh signals for use for producing the location refresh signals during a self refresh test mode of the semiconductor device;
selection circuitry connected to the self refresh circuitry and connected to the memory array for selecting memory locations within the memory array to be refreshed in response to the location refresh signals; and
a self refresh test mode controller connected to the self refresh circuitry and connected to the interface for receiving control signals from the interface and for responding to the control signals by modifying self refreshing operations of the semiconductor device during the self refresh test mode of the semiconductor device.

28. A semiconductor device comprising:
an interface allowing connection with an external device;
a memory array;
self refresh circuitry for producing refresh signals including preliminary refresh signals and location refresh signals, at least some of the preliminary refresh signals for use in producing the location refresh signals, the refresh signals including row address strobe signals and column address strobe signals;
selection circuitry coupled to the self refresh circuitry and the memory array for receiving the location refresh signals and selecting memory locations within the memory array to be refreshed in response to the location refresh signals; and
a self refresh test mode controller coupled to the self refresh circuitry and the interface for placing the semiconductor device in a self refresh test mode and for receiving control signals from the interface and, in response thereto, modifying performance of the semiconductor device while the semiconductor device is in the self refresh test mode.

29. A semiconductor device testing system comprising:
an external testing device; and
a semiconductor device including:
an interface for connection to the external testing device;
a memory array;
self refresh circuitry for producing self refresh signals including preliminary refresh signals and location refresh signals, with at least some of the preliminary refresh signals being used in producing the location refresh signals;
selection circuitry coupled to the self refresh circuitry for selecting memory locations within the memory array to be refreshed in response to the location refresh signals; and
a self refresh test mode controller coupled to the self refresh circuitry and the interface for receiving self refresh test control signals from the external testing device through the interface, for controlling self refresh operations of the self refresh circuitry in response thereto, and for transmitting indicating signals to the interface indicative of at least one of the self refresh signals, the external testing device analyzing the indicating signals for evaluating refreshing of the memory array, including a failure in refreshing, the indicating signals including signals indicative of at least some of the preliminary refresh signals and some of the location refresh signals.

30. The system of claim 29, wherein the selection circuitry includes a row decoder and the memory locations are a row of memory locations.

31. The system of claim 29, wherein interaction between the self refresh test mode controller and the self refresh circuitry includes controlling the self refresh circuitry in producing the self refresh signals.

32. The system of claim 29, wherein interaction between the self refresh test mode controller and the self refresh circuitry includes controlling at least some aspect of the self refresh circuitry.

33. The system of claim 29, wherein the semiconductor device is a first semiconductor device, and further including a second semiconductor device substantially identical to the first semiconductor device that is connected to the external testing device, wherein the external testing device tests the first and second semiconductor devices simultaneously.

34. The system of claim 29, wherein the semiconductor device is a first semiconductor device, and further including a second semiconductor device including, in turn, a self refresh test mode controller controlling and monitoring self refresh signals of the second semiconductor device, and the external testing device testing the first and second semiconductor devices substantially simultaneously.

35. A method for testing signals used in self refresh of a memory array of a semiconductor device, the method comprising:
providing self refresh test control signals from an external testing device for controlling a self refresh test mode within the semiconductor device, the self refresh test control signals including at least some preliminary refresh signals and some location refresh signals;

producing refresh signals including the preliminary refresh signals and the location refresh signals in response to the self refresh test control signals, with at least some of the preliminary refresh signals being used in producing the location refresh signals;

selecting memory locations within the memory array to be refreshed in response to the location refresh signals;

interacting with a self refresh circuitry and providing indicating signals indicative of at least one of the refresh signals; and analyzing the indicating signals, thereby evaluating the self refreshing of the memory array.

36. The method of claim 35, wherein interacting with the self refresh circuitry includes controlling production of the refresh signals.

37. A method of testing self refreshing operations of a semiconductor memory, the method comprising:

causing the semiconductor memory to enter a self refresh test mode by using a Row Address Strobe (RAS) signal and a Column Address Strobe (CAS) signal;

self refreshing the semiconductor memory while the semiconductor memory is in the self refresh test mode; and controlling the self refreshing of the semiconductor memory by providing self refresh test mode control signals to the semiconductor memory from a testing device external to the semiconductor memory during the self refresh test mode of the semiconductor memory.

38. The method of claim 37, wherein the act of self refreshing the semiconductor memory comprises:

outputting self refresh timing signals from a self refresh timer within the semiconductor memory;

outputting row addresses from a self refresh counter of the semiconductor memory in response to the self refresh timing signals; and refreshing rows in a memory array of the semiconductor memory selected in accordance with the row addresses using a row decoder of the semiconductor memory.

39. The method of claim 37, wherein the act of controlling the self refreshing of the semiconductor memory comprises controlling at least one of the self refresh timer, the self refresh counter, and the row decoder of the semiconductor memory using the self refresh test mode control signals.

* * * * *

UNITED STATES PATENT AND TRADEMARK OFFICE
CERTIFICATE OF CORRECTION

PATENT NO.       : 6,545,925 B2
APPLICATION NO.  : 10/062756
DATED            : April 8, 2003
INVENTOR(S)      : Terry R. Lee It is certified that error appears in the above-identified patent and that said Letters Patent is hereby corrected as shown below:

On the title page:

In section (57) ASBSTRACT:

| | | |
|---|---|---|
| 2nd COLUMN, | LINE 18, | change "addresses" to --address is-- |
| 2nd COLUMN, | LINE 22, | change "RAS" to --$\overline{RAS}$-- |
| 2nd COLUMN, | LINE 23, | change "RAS" to --$\overline{RAS}$-- |
| 2nd COLUMN, | LINE 28, | change "RAS" to --$\overline{RAS}$-- |

In the specification:

| | | |
|---|---|---|
| COLUMN 1, | LINE 35, | change "assignee to" to -- assignee of-- |
| COLUMN 2, | LINE 1, | change "$\overline{CA}$" to -- $\overline{CAS}$-- |
| COLUMN 2, | LINE 2, | delete "$\overline{S}$-" appearing at the beginning of the line |
| COLUMN 2, | LINE 6, | change "Dqs" to --DQs-- |
| COLUMN 1, | LINE 13, | change "Dqs" to --DQs-- |
| COLUMN 3, | LINE 19, | change "existing" to --exiting-- |
| COLUMN 3, | LINE 33, | change "burst type" to --burst-type-- |
| COLUMN 3, | LINES 50-51, | change "that for clarity and simplicity" to --that, for clarity and simplicity,-- |
| COLUMN 3, | LINE 64, | change "array 14." to --memory array 14.-- |
| COLUMN 4, | LINE 2, | after "decoder 28," insert --and-- |
| COLUMN 4, | LINE 10, | change "well known" to --well-known-- |
| COLUMN 4, | LINE 15, | after "incorporate" and before "self" insert --a-- |
| COLUMN 4, | LINE 31, | change "system" to --system,-- |
| COLUMN 5, | LINE 6, | change "preliminary signals" to --preliminary refresh signals-- |
| COLUMN 5, | LINE 35, | change "self-refresh" to --self refresh-- |
| COLUMN 5, | LINE 36, | change "self-refresh" to --self refresh-- |
| COLUMN 5, | LINE 38, | change "self-refresh" to --self refresh-- |
| COLUMN 5, | LINE 50, | change "signals, or in addition" to --signals or, in addition,-- |
| COLUMN 6, | LINE 51, | change "array 114." to --memory array 114.-- |
| COLUMN 6, | LINE 65, | change "well known" to --well-known-- |
| COLUMN 8, | LINES 3-4, | change "self-refresh" to --self refresh-- |
| COLUMN 8, | LINES 5-6, | change "self-refresh" to --self refresh-- |
| COLUMN 8, | LINE 8, | change "self-refresh" to --self refresh-- |
| COLUMN 8, | LINE 36, | change "at same" to --at the same-- |
| COLUMN 9, | LINE 11, | change "key board" to --keyboard-- |

UNITED STATES PATENT AND TRADEMARK OFFICE
CERTIFICATE OF CORRECTION

PATENT NO. : 6,545,925 B2
APPLICATION NO. : 10/062756
DATED : April 8, 2003
INVENTOR(S) : Terry R. Lee It is certified that error appears in the above-identified patent and that said Letters Patent is hereby corrected as shown below:

In the specification (continued)
COLUMN 9, LINE 51, change "FIGS." to --figures.--
COLUMN 9, LINE 57, change "well known" to --well-known--

Signed and Sealed this

Twenty-second Day of August, 2006

JON W. DUDAS
*Director of the United States Patent and Trademark Office*